US012593397B2

(12) United States Patent
Lee et al.

(10) Patent No.: US 12,593,397 B2
(45) Date of Patent: Mar. 31, 2026

(54) ELECTRONIC PACKAGE AND METHOD FOR MAKING THE SAME

(71) Applicant: JCET STATS ChipPAC Korea Limited, Incheon (KR)

(72) Inventors: SeungHyun Lee, Incheon (KR); HeeSoo Lee, Incheon (KR); YeJin Park, Incheon (KR)

( * ) Notice: Subject to any disclaimer, the term of this patent is extended or adjusted under 35 U.S.C. 154(b) by 294 days.

(21) Appl. No.: 18/446,487

(22) Filed: Aug. 9, 2023

(65) Prior Publication Data

US 2024/0057249 A1      Feb. 15, 2024

(30) Foreign Application Priority Data

Aug. 10, 2022      (CN) .......................... 202210954826.6

(51) Int. Cl.
H05K 1/00 (2006.01)
H01L 21/56 (2006.01)
(Continued)

(52) U.S. Cl.
CPC ........... H05K 1/0271 (2013.01); H01L 21/56 (2013.01); H01L 23/3121 (2013.01); H01L 23/552 (2013.01); H01L 25/16 (2013.01); H05K 1/18 (2013.01); H05K 3/284 (2013.01); H05K 9/0022 (2013.01); H05K 2201/10189 (2013.01);
(Continued)

(58) Field of Classification Search
CPC ........ H05K 1/0271; H05K 1/18; H05K 3/284; H05K 9/0022; H05K 2201/10189; H05K 2201/2009; H05K 2203/1316; H05K 2203/1322; H01L 21/56; H01L 21/50; H01L 21/565; H01L 23/3121; H01L 23/552; H01L 23/04; H01L 23/562; H01L 23/3107; H01L 23/3157; H01L 23/3171; H01L 23/3185; H01L 23/3114; H01L 23/66; H01L 25/16; H01L 25/50; H01L 25/0655; H01L 25/0652; H01L 25/18;
(Continued)

(56) References Cited

U.S. PATENT DOCUMENTS 6,964,889 B2 11/2005 Ma et al.
2007/0296079 A1 12/2007 Huang et al.
(Continued)

FOREIGN PATENT DOCUMENTS

TW      202129865 A      8/2021
TW      202137350 A      10/2021
TW      202218103 A      5/2022

*Primary Examiner* — Zhengfu J Feng
(74) *Attorney, Agent, or Firm* — Junhe Law Office, P.C.; Yi Zhang

(57) ABSTRACT

An electronic package comprises: a substrate comprising a first region and a second region adjacent to the first region in a lengthwise direction of the substrate; a first electronic component mounted on the substrate in the first region; a second electronic component mounted on the substrate in the second region, wherein the second electronic component does not occupy an entirety of the substrate in a widthwise direction of the substrate; and an encapsulant layer formed on the substrate, wherein at least the second electronic component is exposed from the encapsulant layer, and wherein the encapsulant layer extends from the first region to the second region to reinforce the substrate in both the first region and the second region.

17 Claims, 7 Drawing Sheets

(51) Int. Cl.

| | |
|---|---|
| *H01L 23/31* | (2006.01) |
| *H01L 23/552* | (2006.01) |
| *H01L 25/16* | (2023.01) |
| *H05K 1/02* | (2006.01) |
| *H05K 1/18* | (2006.01) |
| *H05K 3/28* | (2006.01) |
| *H05K 9/00* | (2006.01) |

(52) U.S. Cl.
  CPC ................. *H05K 2201/2009* (2013.01); *H05K 2203/1316* (2013.01); *H05K 2203/1322* (2013.01)

(58) Field of Classification Search
  CPC   H01L 2223/6677; H01Q 1/2283; H01Q 1/38; H01R 12/722
  USPC ......................................................... 361/714
  See application file for complete search history.

(56) References Cited

U.S. PATENT DOCUMENTS

| | | | |
|---|---|---|---|
| 2013/0300002 A1* | 11/2013 | Yokoyama .......... | H01L 23/3135 257/787 |
| 2016/0240493 A1* | 8/2016 | Lee ..................... | H01L 23/3128 |
| 2019/0051989 A1 | 2/2019 | Kim et al. | |
| 2019/0101583 A1 | 4/2019 | Kim | |
| 2019/0189565 A1* | 6/2019 | Chen ..................... | H01L 21/565 |
| 2020/0373244 A1* | 11/2020 | Kang ................... | H01L 23/552 |
| 2021/0028122 A1 | 1/2021 | Son et al. | |
| 2021/0366838 A1 | 11/2021 | Han et al. | |
| 2021/0391278 A1* | 12/2021 | Tai .......................... | H01L 24/16 |

\* cited by examiner

ELECTRONIC PACKAGE AND METHOD FOR MAKING THE SAME

TECHNICAL FIELD

The present application generally relates to semiconductor packaging technology, and more particularly, to an electronic package and a method for making the same.

BACKGROUND OF THE INVENTION

Recently 5G Antenna-in-Packages (AiP) with system and antenna integrated into one package has been adopted for mobile handsets and other portable multimedia devices. However, the compact 5G AiP requires reduced interface pitches, higher interface pin-counts, reduced thickness and higher level integration within the system-based package.

Partial shielding technology has been utilized to achieve the conventional 5G AiP. In particular, a region of the AiP substrate is encapsulated and shielded for semiconductor chips, and another region of the AiP substrate is not encapsulated for board-to-board (B2B) connectors such that the B2B connectors may be connected to an external device. Therefore, the conventional AiP is asymmetrical in structure, resulting unbalanced warpage and low reliability. Particularly, the non-encapsulated region for the B2B connectors is easy to be warped, leading to undesired detachment of the B2B connectors from the AiP substrate.

Therefore, a need exists for providing an electronic package with an improved layout and reliability.

SUMMARY OF THE INVENTION

An objective of the present application is to provide an electronic package with an improved layout and reliability.

According to an aspect of the present application, an electronic package comprises: a substrate comprising a first region and a second region adjacent to the first region in a lengthwise direction of the substrate; a first electronic component mounted on the substrate in the first region; a second electronic component mounted on the substrate in the second region, wherein the second electronic component does not occupy an entirety of the substrate in a widthwise direction of the substrate; and an encapsulant layer formed on the substrate, wherein at least the second electronic component is exposed from the encapsulant layer, and wherein the encapsulant layer extends from the first region to the second region to reinforce the substrate in both the first region and the second region.

According to another aspect of the present application, a method for making an electronic package comprises: providing a substrate comprising a first region and a second region adjacent to the first region in a lengthwise direction of the substrate; mounting a first electronic component on the substrate in the first region; mounting a second electronic component on the substrate in the second region, wherein the second electronic component does not occupy an entirety of the substrate in a widthwise direction of the substrate; and forming an encapsulant layer on the substrate that extends from the first region to the second region to reinforce the substrate in both the first region and the second region, wherein at least the second electronic component is exposed from the encapsulant layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like part.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
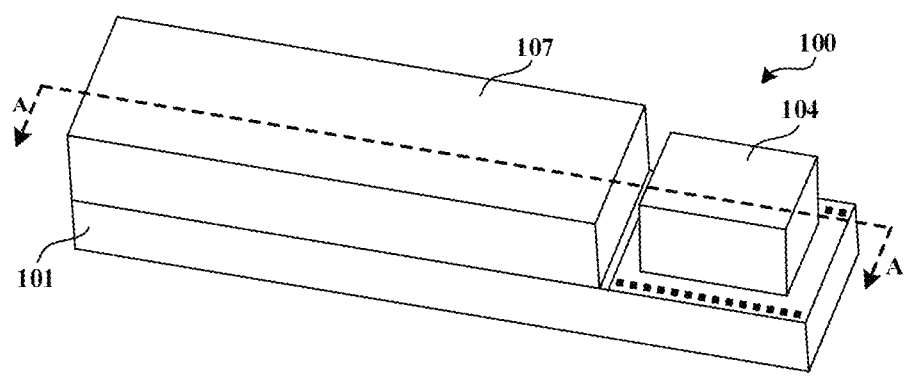
FIGS. 1A to 1C are schematic diagrams showing a conventional electronic package.
Figure 1B:
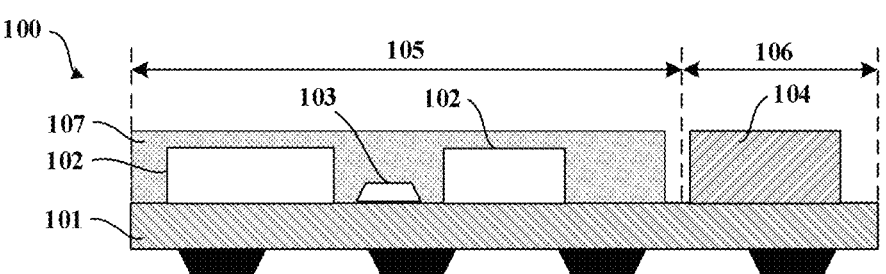
Figure 1C:
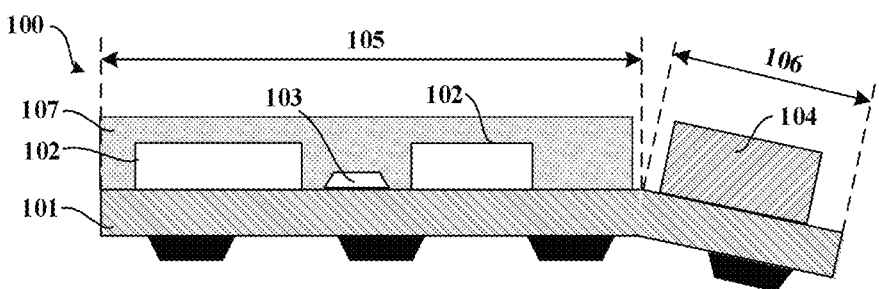

FIGS. 1A to 1C are schematic diagrams showing a conventional electronic package 100. FIG. 1A is a perspective view of the conventional electronic package 100, FIG. 1B is a cross-sectional view along section line A-A in FIG. 1A, and FIG. 1C is a cross-sectional view of the conventional electronic package 100 when it is warped.

As shown in FIGS. 1A to 1C, a substrate 101 of the electronic package 100 is selectively encapsulated. In particular, a first region 105 of the substrate 101 where two semiconductor components 102 (e.g., a semiconductor package or a semiconductor die) and a discrete electronic component 103 (e.g., a passive component such as a capacitor or a resistor) are mounted is encapsulated by an encapsulant layer 107. Further, a second region 106 of the substrate 101 where a connector assembly 104 is mounted is not encapsulated by the encapsulant layer 107, such that the connector assembly 104 may be exposed to be connected to an external device such as a printed circuit board or another electronic device. It can be seen that the electronic package 100 is asymmetrical in structure, and a stress may concentrate at a boundary between the encapsulated first region 105 and the non-encapsulated second region 106. Therefore, the second region 106 of the substrate 101 may be easily warped from the first region 105, as is shown in FIG. 1C.

Figure 2A:
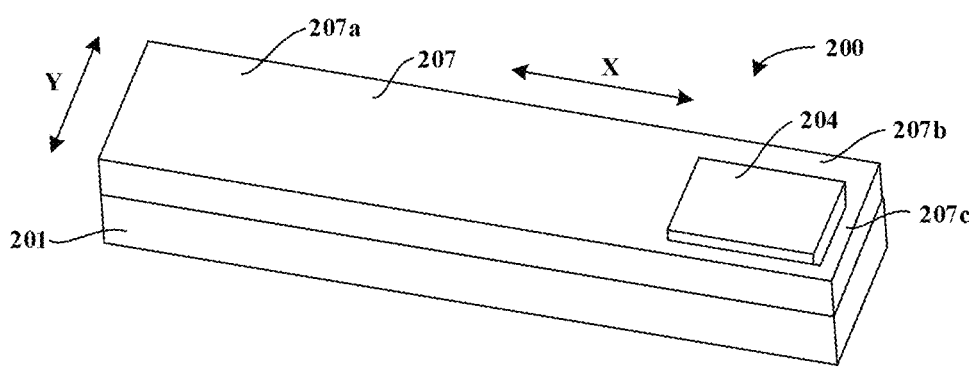
FIGS. 2A to 2C are schematic diagrams showing an electronic package according to one embodiment of the present application.
Figure 2B:
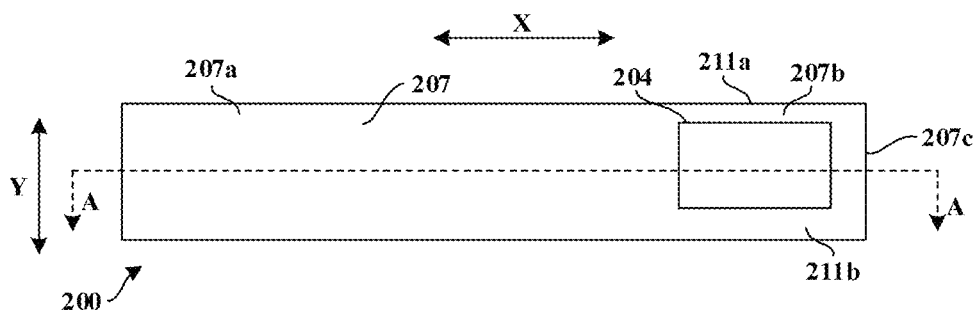
Figure 2C:
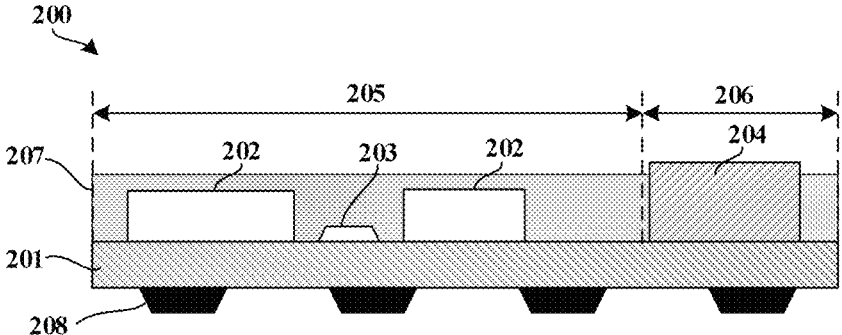

FIGS. 2A to 2C are schematic diagrams showing an electronic package 200 according to one embodiment of the present application. FIG. 2A is a perspective view of the electronic package 200, FIG. 2B is a top view of the electronic package 200 in FIG. 2A, and FIG. 2C is a cross-sectional view along section line A-A in FIG. 2B.

As shown in FIGS. 2A to 2C, the electronic package 200 includes a substrate 201 with one or more substrate conductive patterns embedded therein. The substrate 201 can be a laminate interposer, PCB, wafer-form, strip interposer, leadframe, or another suitable substrate. The substrate 201 may include one or more insulating or passivation layers, one or more conductive vias formed through the insulating layers, and one or more conductive layers formed over or between the insulating layers. The substrate 201 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The substrate 201 can also be a multi-layer flexible laminate, ceramic, copper clad laminate, glass, or semiconductor wafer including an active surface containing one or more transistors, diodes, and other circuit elements to implement analog circuits or digital circuits. The substrate 201 may include one or more electrically conductive layers or redistribution layers (RDL) formed using sputtering, electrolytic plating, electroless plating, or other suitable deposition process. The substrate conductive patterns may be one or more layers of Al, Cu, Sn, Ni, Au, Ag, titanium (Ti), tungsten (W), or other suitable electrically conductive material.

One or more semiconductor components 202 such as a semiconductor die or a semiconductor package, one or more discrete components 203 and a connector assembly 204 are mounted on a top surface of the substrate 201. One or more antenna modules 208 are mounted on a bottom surface 201b of the substrate 201. The connector assembly 204 is for coupling the electronic components mounted on the substrate 201 with external devices. Although the electronic package 200 is shown as FIGS. 2A to 2C for illustration purpose, those skilled in the art can understand that an electronic package may include more semiconductor components and/or discrete components and/or antenna modules, or may not include one or more of the semiconductor components, such as the discrete component or the antenna module. For example, the semiconductor components 202 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The discrete components 203 may include one or more passive electrical components such as resistors, capacitors, inductors, etc. The connector assembly 204 may include one or more connectors which are mounted on the substrate 201 either separately or as an integral structure. The connector assembly 204 has one or more exposed terminals (not shown).

In particular, the substrate 201 may have a first region 205 and a second region 206 adjacent to the first region 205 in a lengthwise direction X of the substrate 201. The semiconductor components 202 and the discrete component 203 are mounted in the first region 205, and the connector assembly 204 is mounted in the second region 206. There may be some space between the components on the substrate 201 and a periphery of the top surface of the substrate 201, so that the semiconductor components 202, the discrete component 203 and the connector assembly 204 do not occupy an entirety of the substrate 201 in a widthwise direction Y of the substrate 201. For example, as shown in FIG. 2B, there is some space 211a and 211b between the connector assembly 204 and the periphery of the top surface of the substrate 201. The unoccupied space may prevent the connector assembly 204 from extending beyond the periphery of the top surface of the substrate 201, and thus reduce undesired detachment of the connector assembly 204 from the substrate 201 due to shock. In practice, the semiconductor components 202, the discrete component 203 and the connector assembly 204 can be mounted onto the substrate 201 using any suitable surface mounting techniques, such as surface mounting.

In the embodiment shown in FIGS. 2A to 2C, the first region 205 of the substrate 201 may be encapsulated by an encapsulant layer 207. The encapsulant layer 207 covers the semiconductor components 202 and the discrete component 203 and the remaining top surface in the first region 205 uncovered by the semiconductor components 202 and the discrete component 203. Furthermore, the second region 206 of the substrate 201, where the connector assembly 204 is mounted, is also encapsulated in part by the encapsulant layer 207. In particular, other than that the connector assembly 204 is exposed from the encapsulant layer 207, the remaining top surface in the second region 206 is also covered by the encapsulant layer 207, including the two spaces 211a and 211b besides the connector assembly 204. That is, the encapsulant layer 207 extends from the first region 205 to the second region 206 to reinforce the substrate 201 in both the first region 205 and the second region 206. In some embodiments, the encapsulant layer 207 may extend further beyond the connector assembly 204 so that the connector assembly 204 is surrounded by the encapsulant layer 207. The encapsulant material of the encapsulant layer 207 may be made of a polymer composite material such as epoxy resin with filler, epoxy acrylate with filler, or polymer with proper filler, for example.

In some embodiments, the encapsulant layer 207 in both the first region 205 and the second region 206 may be formed simultaneously, e.g., using an injection molding process. Accordingly, the encapsulant layer 207 on the top surface of the substrate 201 may have a uniform thickness, which is at least sufficient to cover the components in the first region 205. In some embodiment, a height of the connector assembly 204 may be bigger than the thickness of the encapsulant layer 207, or may be smaller than the thickness of the encapsulant layer 207, or may be equal to the thickness of the encapsulant layer 207. In the embodiment shown in FIGS. 2A to 2C, the height of the connector assembly 204 may be bigger than the thickness of the encapsulant layer 207, which ensures that the connector assembly 204 can be exposed from the encapsulant layer 207.

As shown in FIGS. 2A and 2B, the encapsulant layer 207 includes a main body 207a in the first region 205 and two reinforcement walls 207b in the second region 206, and the reinforcement walls 207b are integrally formed with the main body 207a. The main body 207a may surround the semiconductor components 202 and the discrete component 203, while the two reinforcement walls 207b are respectively disposed at two lateral sides of the connector assembly 204, i.e., in the two spaces 211a and 211b besides the connector assembly 204. The reinforcement walls 207b in parallel with the connector assembly 204 can reinforce the substrate 201 and thus prevent stress from accumulating at the boundary between the first region 205 and the second region 206. In this way, the risk that the substrate 201 may be warped at the boundary can be significantly reduced. As aforementioned, the two reinforcement walls 207b may extend over an entire length of the second region 206 in the lengthwise direction X as shown in FIGS. 2B and 2C. In another embodiment, the two reinforcement walls 207b may extend over a portion of the length of the second region 206 in the lengthwise direction X, such as a half of the length of the second region 206. In some embodiments, the two reinforcement walls 207b may have a thickness equal to, or bigger than, or smaller than a thickness of the main body 207a.

Still referring to FIGS. 2A to 2C, the encapsulant layer 207 may further include a connection wall 207c formed in the second region 206, which traverses across the connector assembly 204 and connects the two reinforcement walls 207b at an end of the second region 206. The connection wall 207c can strengthen the connection of the enforcement walls 207b on the top surface of the substrate 201. Similarly, the connection wall 207c may be integrally formed with the main body 207a and the enforcement walls 207b. In some other embodiments, the connection wall 207c may be located at an end of the connector assembly 204 close to the first region 205, which is similar to traversing across the connector assembly 204 and connecting the two reinforcement walls 207b; or there may be one or more connection walls disposed on the periphery of the connector assembly 204 simultaneously.

In some embodiments, a shielding layer (not shown) may be formed on the encapsulant layer 207 for shielding electronic interferences, while the components in the first region 205 may be covered by the encapsulant layer 207. The shielding layer 207 may be formed of a conductive material such as Al, Cu, Sn, Ni, Au, Ag, etc. For example, a sputtering process, or other similar chemical or physical vapor deposition process can be used to form the shielding layer. In some alternative embodiments, the components in the first region 205 may be exposed from the encapsulant layer 207, and a lid for heat dissipation may be attached on the exposed components as well as on the encapsulant layer 207 in the first region 205.

Figure 3A:
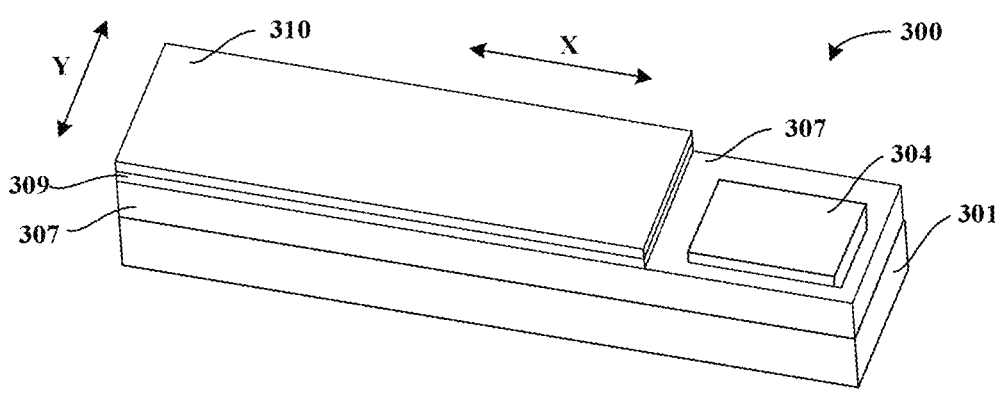
FIGS. 3A to 3C are schematic diagrams showing an electronic package according to another embodiment of the present application.
Figure 3B:
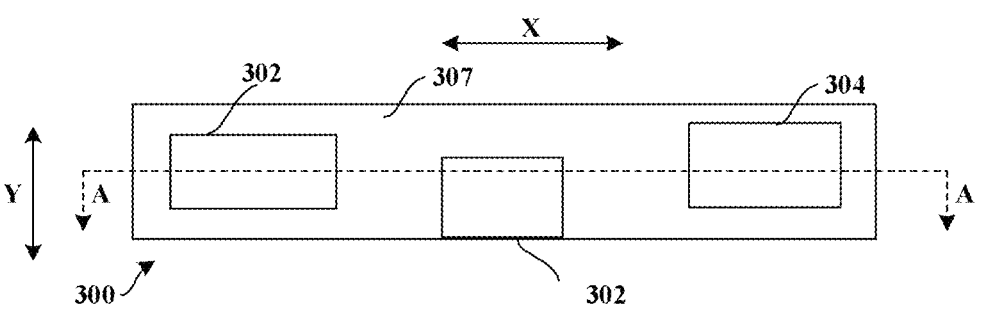
Figure 3C:
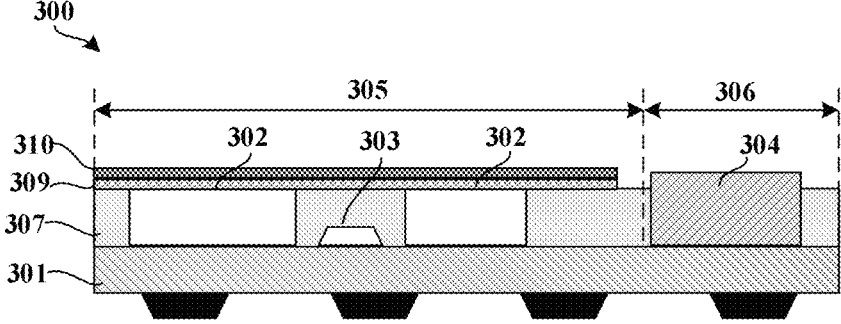

FIGS. 3A to 3C are schematic diagrams showing an electronic package 300 according to another embodiment of the present application. FIG. 3A is a perspective view of the electronic package 300, FIG. 3B is a top view of the electronic package 300 with a lid 310 and a shielding layer 309 removed, and FIG. 3C is a cross sectional view of the electronic package 300.

As shown in FIGS. 3A to 3C, the electronic package 300 includes electronic components 302 and 303 mounted in a first region 305 and a connector assembly 304 in a second region 306 of a substrate 301. A portion of the electronic components 302 and 303, which may be semiconductor components 302, are exposed from an encapsulant layer 307, and optionally exposed from a shielding layer 309. A lid 310 is disposed on the encapsulant layer 307 for heat dissipation. In the embodiment, the lid 310 is adhered to the encapsulant layer 307 through an adhesive material such as a thermal interfacing material (TIM). The TIM layer may be disposed between the lid 310 and the encapsulant layer 307 to improve heat transfer between the semiconductor components 302 and the lid 310. Although the encapsulant layer 307 covers both the first region 305 and the second region 306 except for the connector assembly 304, the lid 310 covers mainly the encapsulant layer 307 in the first region 305, without extending into the second region 306, as heat may be generally generated from the electronic components 302.

FIGS. 4A to 4G are cross-sectional views illustrating various steps of a method for making an electronic package 400 according to an embodiment of the present application.

Figure 4A:
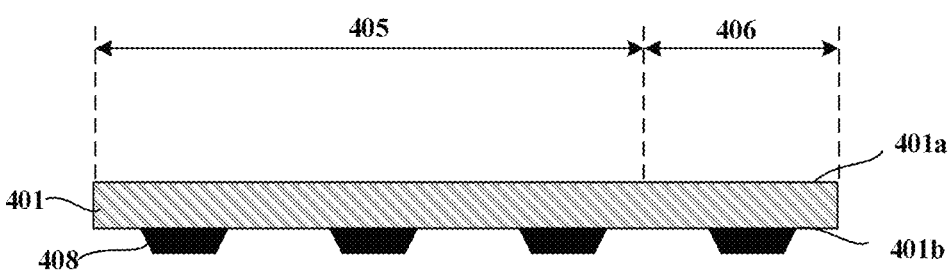
FIGS. 4A to 4G are cross-sectional views illustrating various steps of the method for making an electronic package according to an embodiment of the present application.

Referring to FIG. 4A, a substrate 401 is provided. The substrate 401 may include a top surface 401a and a bottom surface 401b. One or more antenna modules 408 may be mounted on the bottom surface 401b in advance. The top surface 401a may include a first region 405 and a region 406 which may be predetermined according to electronic components to be mounted in a later stage. In FIG. 4A, the substrate 401 is placed on a carrier or the like, with the top surface 401a being oriented upward for subsequent components mounting.

Solder paste (not shown) may be formed, e.g., printed, on the substrate 401 at locations where conductive patterns are preformed. In this way, the electronic components can be surface mounted onto the top surface 401a. In some embodiments, the solder paste may be dispensed by jet printing, laser printing, pneumatically, by pin transfer, using a photoresist mask, by stencil-printing, or by another suitable process.

Figure 4B:
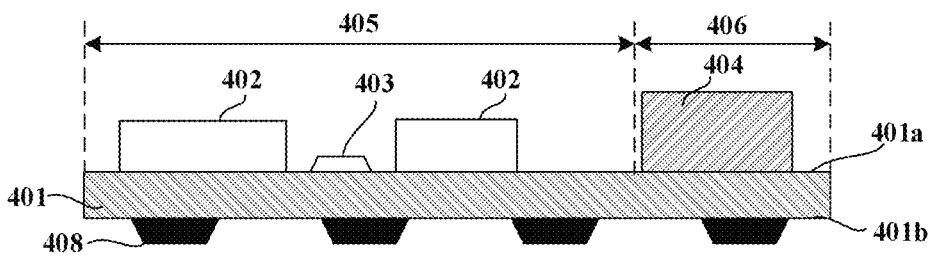

Next to FIG. 4B, the electronic components including various semiconductor components 402 and discrete components 403 are mounted on the top surface 401a in the first region 405 through such as the pre-dispensed solder paste, and a connector assembly 404 is mounted on the top surface 401a in the second region 406 through solder paste as well.

Figure 4C:
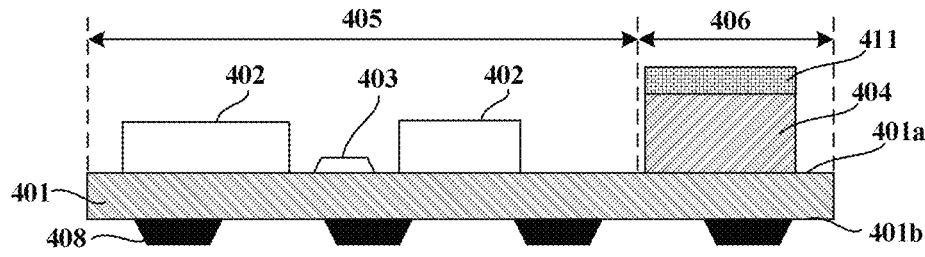

Next to FIG. 4C, a tape 411 is disposed on a top surface of the connector assembly 404, severing as a mask for the subsequent processing. The tape 411 may have a shape and size substantially the same as a shape and size of the top surface of the connector assembly 404. In this way, it can be avoided that excess encapsulant material covers the top surface of the connector assembly 404 and that voids are formed in the encapsulant layer 407, especially surrounding the connector assembly 404. In one embodiment, the tape 411 may include an adhesive layer and a non-adhesive layer, and the tape 411 is adhered to the connector assembly 404 through the adhesive layer. For example, the tape 411 may include a UV tape, a thermal tape, a multi-layer tape (polyimide tape with adhesive), or etc.

Figure 4D:
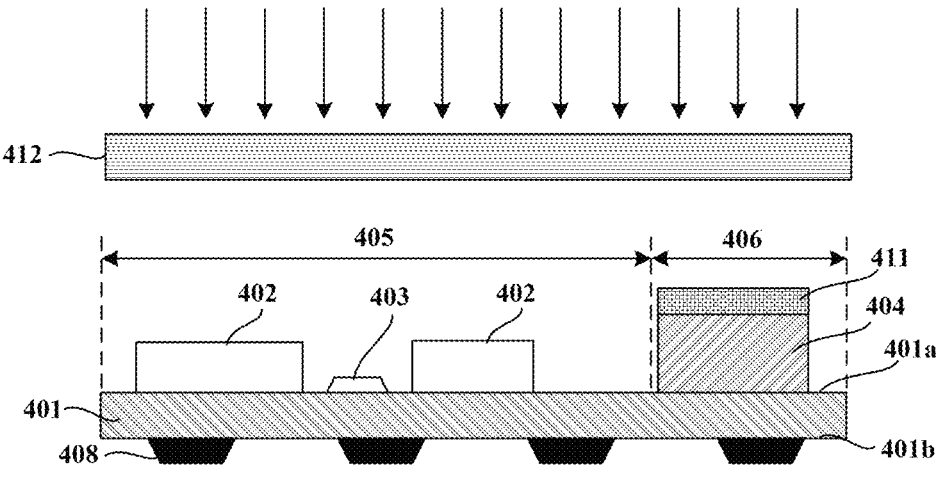
Figure 4E:
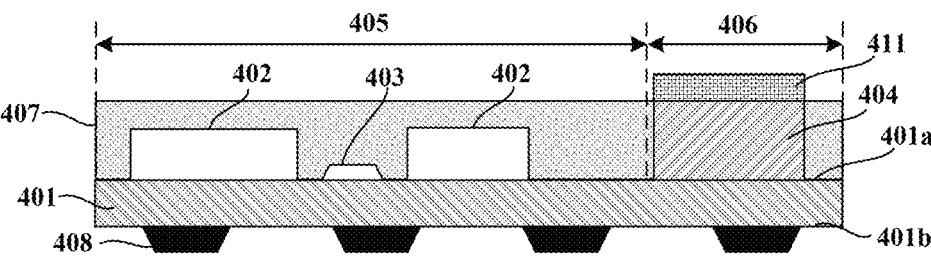

Afterwards, as illustrated in FIG. 4D, a mold chase 412 is disposed over the top surface 401a of the substrate 401, and then in FIG. 4E, an encapsulant material is injected into the mold chase to form an encapsulant layer 407 in the first region 405 and in the second region 406 of the substrate 401. The encapsulant layer 407 can cover the entire top surface 401a except for the connector assembly 404 covered by the tape 411. After the encapsulant layer 407 is solidified, e.g., through a curing process, the mold chase can be removed off the substrate 401.

Figure 4F:
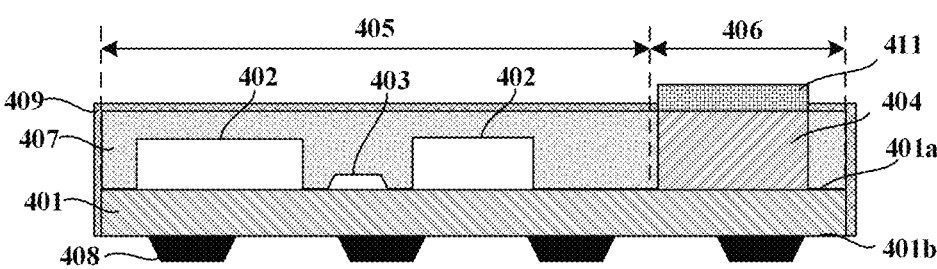

Subsequently, referring to FIG. 4F, a shielding layer 409 is formed over the encapsulant layer 407. The shielding layer 409 may be formed by spray coating, plating, sputtering, or any other suitable metal deposition process. In some embodiments, the shielding layer 409 may be formed from copper, aluminum, iron, or any other suitable material for EMI shielding. The tape 411 is maintained on the connector assembly 404 during the shielding layer deposition process, to avoid the formation of the shielding layer on the top surface of the connector assembly 404.

Figure 4G:
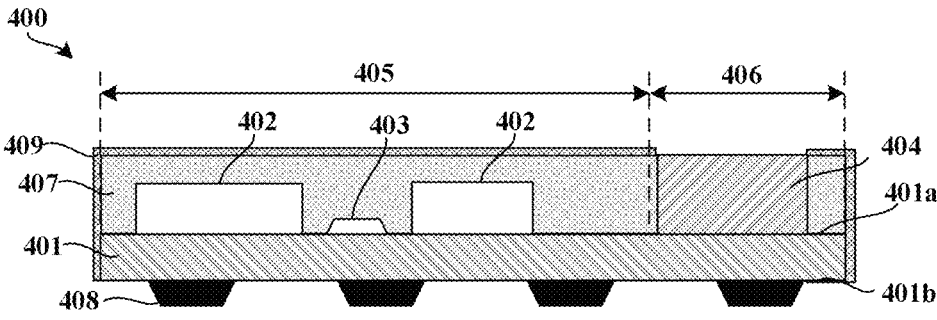

Next, referring to FIG. 4G, the tape 411 can be detached off the substrate 401 such that the encapsulant layer and the shielding layer deposited on the tape 411 can be removed with the tape 411, and the connector assembly 404 is then exposed from the encapsulant layer 407 and the shielding layer 409 in the other regions of the substrate 401. In one embodiment, the top area of the connector assembly 404 covered by the tape 411 may be opened through film assistance molding. In the embodiment, a height of the connector assembly 404 is smaller than a thickness of the encapsulant layer 407, and thus a cavity may be formed in the encapsulant layer 407 above the connector assembly 404.

FIGS. 5A to 5E are cross-sectional views illustrating various steps of a method for making an electronic package 500 according to another embodiment of the present application.

Figure 5A:
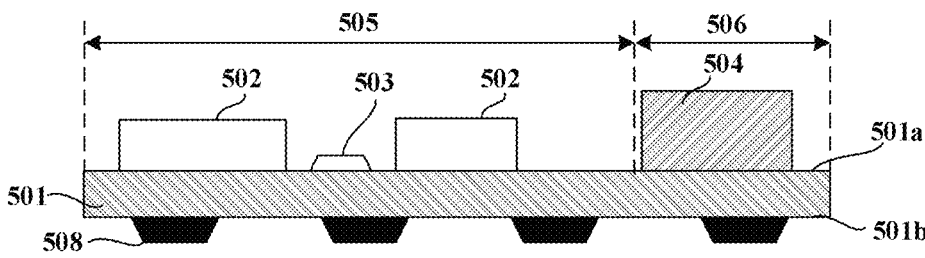
FIGS. 5A to 5E are cross-sectional views illustrating various steps of the method for making an electronic package according to another embodiment of the present application.

As illustrated in FIG. 5A, a substrate 501 with antenna modules 508 mounted on its bottom surface 501b is provided. Various semiconductor components 502 and discrete components 503 are mounted in a first region 505 of a top surface 501a of the substrate 501, and a connector assembly 504 is mounted in a second region 506 of the top surface 501a as well. The components 502 and 503 and the connector assembly 504 may be of different heights, or in particular, the connector assembly 504 may be slightly higher than the components 502 and 503.

Figure 5B:
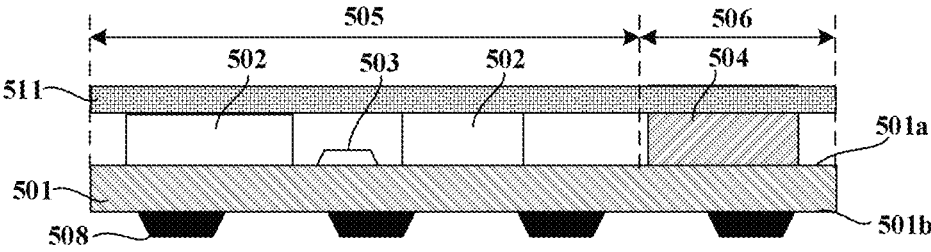

Next to FIG. 5B, a tape 511 may be attached to the substrate 501 to cover respective top surfaces of the components 502 and 503 and the connector assembly 504. The tape 511 may be of a flexible material such that a portion of the tape 511 that covers the connector assembly 504 may be deformed to form a generally flat top surface, i.e., the highest connector assembly 504 may be embedded within the tape 511. In an alternative embodiment, various tape segments may be attached to the respective top surfaces of the components 502 and 503 and the connector assembly 504. Each tape segments may have a size and shape that is substantially the same as a size and shape of the component that is covered by the tape segment.

Figure 5C:
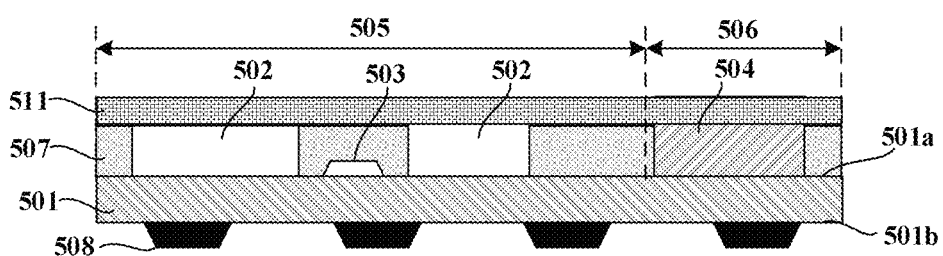
Figure 5D:
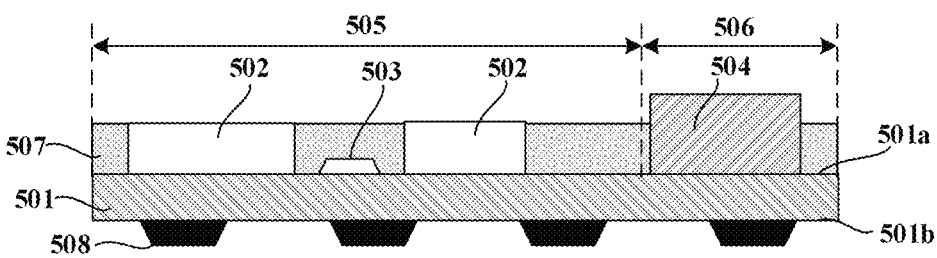
Figure 5E:
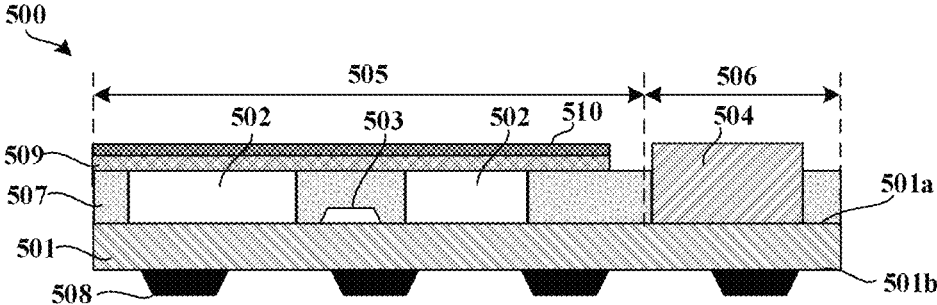

Afterwards, as illustrated in FIG. 5C, a mold chase is disposed over the top surface 501a of the substrate 501, and an encapsulant material is injected into the mold chase to form an encapsulant layer 507 in the first region 505 and second region 506 over the top surface 501a of the substrate 501. The encapsulant layer 507 may diffuse into gaps between the components 502 and 503 and the connector assembly 504 and surround them. The tape 511 may then be removed, as shown in FIG. 5D. Next, in FIG. 5E, a lid 510 may be attached to the top surfaces of the semiconductor components 502 and the encapsulant layer 507. In some embodiments, a shielding layer 509 and/or a thermal interfacing material layer may be formed between the encapsulant layer 507 and the lid 510 in the first region 505. It can be appreciated that when various tape segments are used in the preceding process, the tape segment covering the connector assembly 504 may be removed after the lid attachment. In this way, the substrate 501 can be well protected and reinforced by the encapsulant layer 507 on the substrate 501, without affecting the connector assembly 504.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An electronic package, comprising:

a substrate comprising a first region and a second region adjacent to the first region in a lengthwise direction of the substrate;

a first electronic component mounted on the substrate in the first region;

a second electronic component mounted on the substrate in the second region, wherein the second electronic component does not occupy an entirety of the substrate in a widthwise direction of the substrate; and an encapsulant layer formed on the substrate, wherein at least the second electronic component is exposed from the encapsulant layer, and wherein the encapsulant layer extends from the first region to the second region to reinforce the substrate in both the first region and the second region;

wherein the encapsulant layer comprises:

a main body in the first region and at least surrounding the first electronic component, and two reinforcement walls in the second region, wherein the two reinforcement walls are integrally formed with the main body, wherein the two reinforcement walls extend over an entire length of the second region.

2. The electronic package of claim 1, wherein the two reinforcement walls have a thickness equal to that of the main body.

3. The electronic package of claim 1, wherein the two reinforcement walls are disposed at two lateral sides of the second electronic component, respectively.

4. The electronic package of claim 1, wherein the encapsulant layer further comprises:

one or more connection walls formed in the second region, wherein the one or more connection walls traverse across the second electronic component and connect the two reinforcement walls.

5. The electronic package of claim 1, wherein the first electronic component is covered by the encapsulant layer.

6. The electronic package of claim 1, wherein the first electronic component is exposed from the encapsulant layer.

7. The electronic package of claim 6, further comprising:

a lid disposed over the first electronic component for heat dissipation.

8. The electronic package of claim 7, further comprising:

a shielding layer disposed between the first electronic component and the lid.

9. The electronic package of claim 1, wherein the second electronic component comprises a connector assembly.

10. A method for making an electronic package, comprising:

providing a substrate comprising a first region and a second region adjacent to the first region in a lengthwise direction of the substrate;

mounting a first electronic component on the substrate in the first region;

mounting a second electronic component on the substrate in the second region, wherein the second electronic component does not occupy an entirety of the substrate in a widthwise direction of the substrate; and forming an encapsulant layer on the substrate that extends from the first region to the second region to reinforce the substrate in both the first region and the second region, wherein at least the second electronic component is exposed from the encapsulant layer;

wherein the encapsulant layer comprises:

a main body in the first region and at least surrounding the first electronic component, and two reinforcement walls in the second region, wherein the two reinforcement walls are integrally formed with the main body, wherein the two reinforcement walls extend over an entire length of the second region.

11. The method of claim 10, wherein forming an encapsulant layer on the substrate comprises:

attaching a tape on a top surface of the second electronic component;

attaching a mold chase above the substrate;

injecting an encapsulant material into the mold chase; and detaching the tape from the top surface of the second electronic component.

12. The method of claim 11, wherein attaching a tape on a top surface of the second electronic component further comprises:

attaching a first tape on a top surface of the first electronic component;

attaching a second tape on a top surface of the second electronic component.

13. The method of claim 11, wherein attaching a tape on a top surface of the second electronic component further comprises:

attaching a tape from a top surface of the first electronic component to a top surface of the second electronic component.

14. The method of claim 11, wherein the first electronic component is exposed from the encapsulant layer.

15. The method of claim 14, further comprising mounting a lid over the first electronic component for heat dissipation.

16. The method of claim 14, wherein before mounting a lid over the first electronic component, forming a shielding layer over the first electronic component for shielding interference.

17. The method of claim 12, wherein the first electronic component is exposed from the encapsulant layer.

\* \* \* \* \*